(12) United States Patent
Belfiglio

(10) Patent No.: US 10,198,037 B2
(45) Date of Patent: Feb. 5, 2019

(54) LOW PROFILE AUXILIARY COMPONENT MOUNTING ARTICLE

(71) Applicant: Ralph Belfiglio, New London, CT (US)

(72) Inventor: Ralph Belfiglio, New London, CT (US)

(73) Assignee: CASE BYTE TECHNOLOGY, LLC, New London, CT (US)

( * ) Notice: Subject to any disclaimer, the term of this patent is extended or adjusted under 35 U.S.C. 154(b) by 0 days.

(21) Appl. No.: 15/880,040

(22) Filed: Jan. 25, 2018

(65) Prior Publication Data

US 2018/0224892 A1 Aug. 9, 2018

Related U.S. Application Data

(60) Provisional application No. 62/455,769, filed on Feb. 7, 2017.

(51) Int. Cl.
  *G06F 1/16* (2006.01)
  *H01R 13/60* (2006.01)
  *H05K 5/02* (2006.01)

(52) U.S. Cl.
  CPC .......... *G06F 1/1637* (2013.01); *G06F 1/1616* (2013.01); *G06F 1/1628* (2013.01); *G06F 1/1656* (2013.01); *H01R 13/60* (2013.01); *H05K 5/0213* (2013.01); *H05K 5/0247* (2013.01)

(58) Field of Classification Search
  CPC .............................. G06F 1/1656; H01R 13/60
  See application file for complete search history.

(56) References Cited

U.S. PATENT DOCUMENTS

| | | | |
|---|---|---|---|
| 6,256,193 B1 | 7/2001 | Janik et al. | |
| 6,267,608 B1 * | 7/2001 | Yagi ...................... | H01R 13/447 439/142 |
| 6,839,237 B2 * | 1/2005 | Berry ................... | H05K 7/1489 312/223.2 |
| 7,236,356 B2 | 6/2007 | Ulla et al. | |
| 7,542,284 B1 | 6/2009 | Wilson, Sr. | |
| 7,746,629 B2 | 6/2010 | Assouad et al. | |
| 7,857,659 B2 * | 12/2010 | Wang ........................ | G06F 1/16 439/501 |
| 7,859,836 B2 | 12/2010 | Bae | |
| 8,127,155 B2 | 2/2012 | Baarman et al. | |
| 8,559,171 B2 | 10/2013 | Cummins | |
| 2003/0017737 A1 * | 1/2003 | Homer ................... | H01R 13/60 439/344 |

(Continued)

*Primary Examiner* — Adrian S Wilson
(74) *Attorney, Agent, or Firm* — Tobin, Carberry, O'Malley, Riley, Selinger, P.C.; Steven M. McHugh

(57) ABSTRACT

A low profile component mounting article is provided and includes a structure base, wherein the structure base defines a base cavity for containing a laptop computing device. The structure base further defines a cable opening and is configured to contain an auxiliary component having a connector cable, wherein the cable opening is communicated with the base cavity, and wherein when the auxiliary component is located within the base cavity, at least a portion of the extends out of the cable opening. Additionally, the structure base further includes a cable storage mount located proximate the cable opening and configured to removably contain the connector cable and a cable connector mount located proximate the cable storage mount and configured to removably contain the cable connector.

20 Claims, 22 Drawing Sheets

(56) References Cited

U.S. PATENT DOCUMENTS

| | | | |
|---|---|---|---|
| 2003/0165237 A1* | 9/2003 | Farr | H04M 1/15 |
| | | | 379/430 |
| 2004/0085726 A1* | 5/2004 | Ting | G06F 1/1616 |
| | | | 361/679.41 |
| 2005/0152110 A1 | 7/2005 | Chen | |
| 2005/0213297 A1 | 9/2005 | Ulla et al. | |
| 2006/0027697 A1* | 2/2006 | Gojanovic | B65H 75/4434 |
| | | | 242/388.1 |
| 2006/0061964 A1 | 3/2006 | Cheng | |
| 2007/0258204 A1* | 11/2007 | Chang | G06F 1/1616 |
| | | | 361/679.4 |
| 2011/0107359 A1* | 5/2011 | Lee | G11B 33/025 |
| | | | 720/600 |
| 2012/0002367 A1 | 1/2012 | DeFronzo | |

* cited by examiner

LOW PROFILE AUXILIARY COMPONENT MOUNTING ARTICLE

RELATED APPLICATIONS

This application is related to and claims the benefit of U.S. Provisional Patent Application Ser. No. 62/455,769 filed Feb. 7, 2017, the contents of which are incorporated by reference herein in its entirety.

FIELD OF THE INVENTION

The present invention relates generally to laptop computers and more particularly to an auxiliary hard drive for a laptop computer.

BACKGROUND OF THE INVENTION

One of the biggest problems with portable computing devices (such as a laptop computer or a tablet) is the lack of available storage space, or hard drive capacity. This is especially true for laptops, or tablets, where the computing devices are either not configured, or do not have the capacity, to increase the size of the hard drive or to add additional hard drives due to enclosure size or access. One solution to this problem is to attach an auxiliary hard drive to the laptop or tablet, where the auxiliary hard drive plugs into the computing device via an external connection, such as a USB connection. Unfortunately however, current methods for associating these auxiliary hard drives with laptops or tablets involve carrying around the auxiliary hard drive along with its connector cables, which requires attaching the hard drive to the laptop with the connector cable every time the user uses the laptop, or tablet. This is undesirable because it requires an external carrier, which may be substantially sized, and an inconvenient setup configuration, such as a surface to support the auxiliary hard drive.

SUMMARY OF THE INVENTION

A low profile auxiliary hard drive mounting article is provided and includes a structure top cover and a structure base. The structure base includes a base top, a base bottom, a base front, a base rear and base sides which define a base cavity, wherein the structure top cover is configured to at least partially enclose the base cavity. The structure base further defines a component cavity and a cable opening, wherein the cable opening is communicated with the component cavity, and wherein the component cavity is configured to contain an auxiliary hard drive and at least a portion of a connector cable having a cable connector. The cable opening is configured to allow at least a portion of the connector cable and the cable connector to extend therefrom and the structure base further includes a cable storage mount and a cable connector mount, wherein the cable storage mount is located proximate the cable opening. Additionally, the cable storage mount is configured to securingly contain the connector cable and the cable connector mount is configured to securingly contain the cable connector.

A low profile component mounting article is provided and includes a structure base, wherein the structure base includes a base top, a base bottom, a base front, a base rear and base sides which define a base cavity. The structure base further defines a component cavity and a cable opening, wherein the cable opening is communicated with the component cavity, and wherein the component cavity is configured to contain an auxiliary component and at least a portion of a connector cable having a cable connector, wherein the cable opening is configured to allow at least a portion of the connector cable and the cable connector to extend therefrom. Moreover, the structure base further includes a cable storage mount and a cable connector mount, wherein the cable storage mount is located proximate the cable opening.

A low profile component mounting article is provided and includes a structure base, wherein the structure base defines a base cavity for containing a laptop computing device. The structure base further defines a cable opening and is configured to contain an auxiliary component having a connector cable, wherein the cable opening is communicated with the base cavity, and wherein when the auxiliary component is located within the base cavity, at least a portion of the extends out of the cable opening. Additionally, the structure base further includes a cable storage mount located proximate the cable opening and configured to removably contain the connector cable and a cable connector mount located proximate the cable storage mount and configured to removably contain the cable connector.

BRIEF DESCRIPTION OF THE DRAWINGS

The foregoing and other features and advantages of the present invention should be more fully understood from the accompanying detailed description of illustrative embodiments taken in conjunction with the following Figures in which like elements are numbered alike in the several Figures.

DETAILED DESCRIPTION OF THE INVENTION

Figure 1:
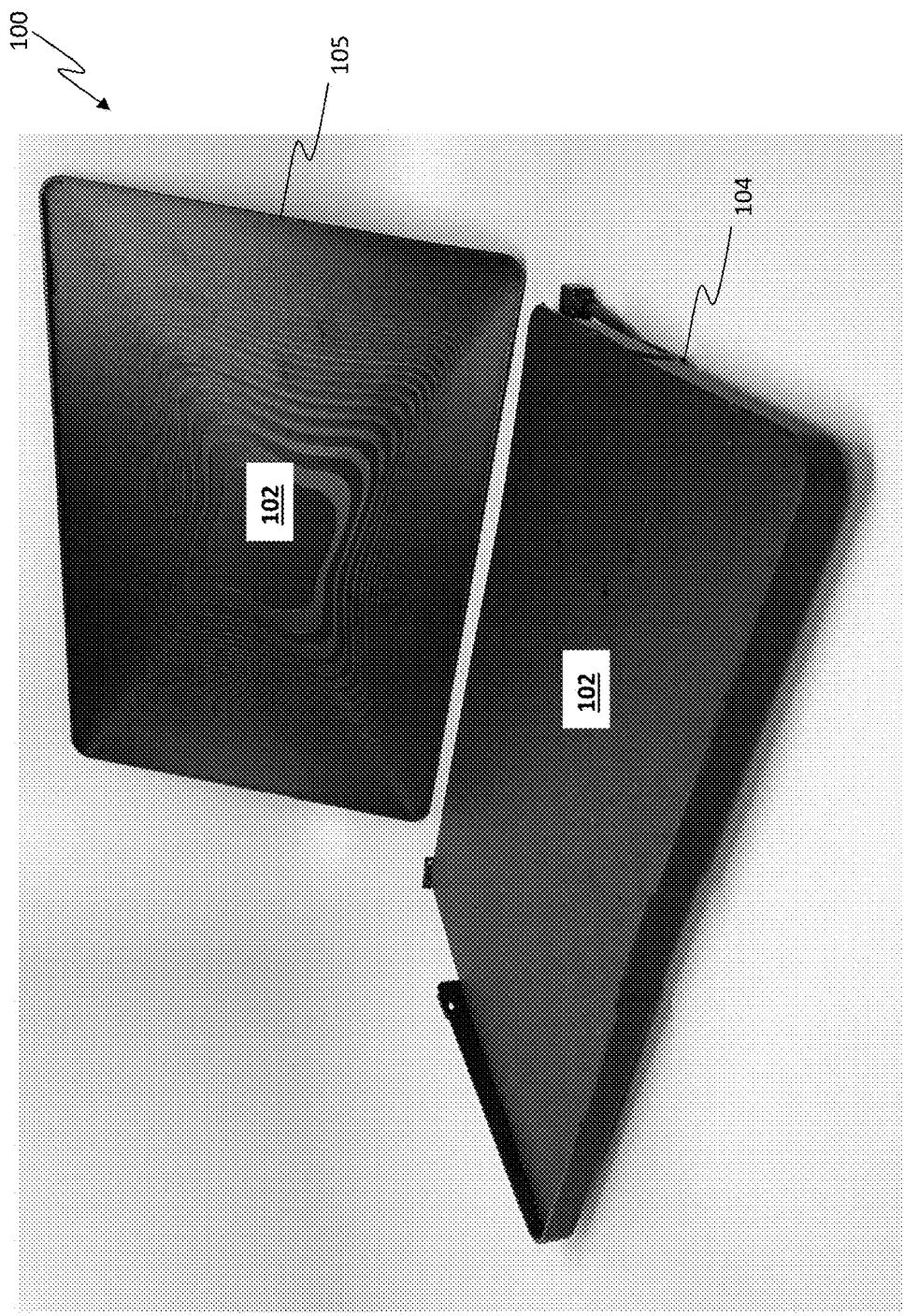
FIG. 1 illustrates a front side view of an auxiliary hard drive mounting system, in accordance with one embodiment of the present invention.
Figure 2:
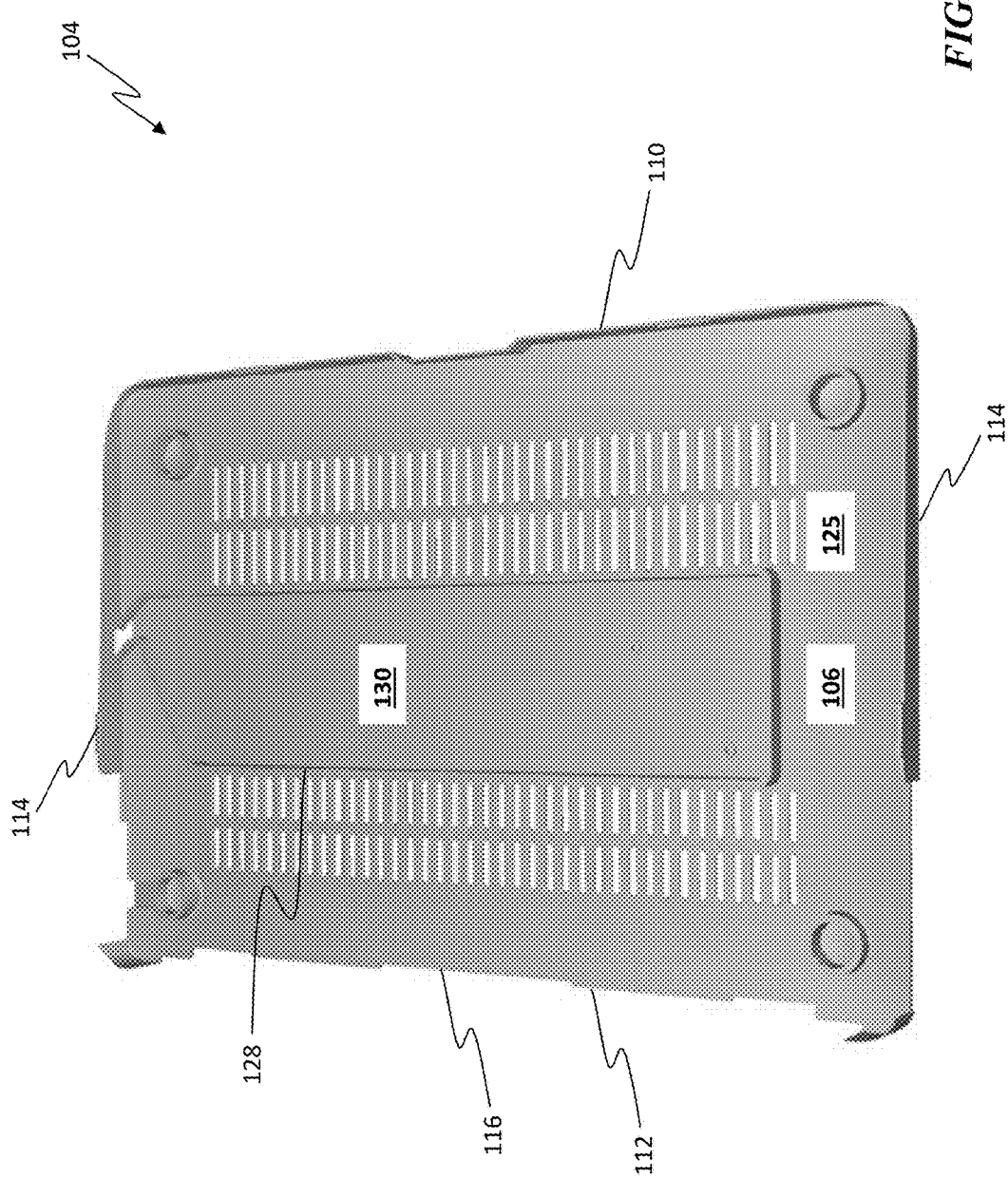
FIG. 2 illustrates a top down side isometric view of a structure base without the base cover of the auxiliary hard drive mounting article of FIG. 1, in accordance with one embodiment of the present invention.
Figure 3:
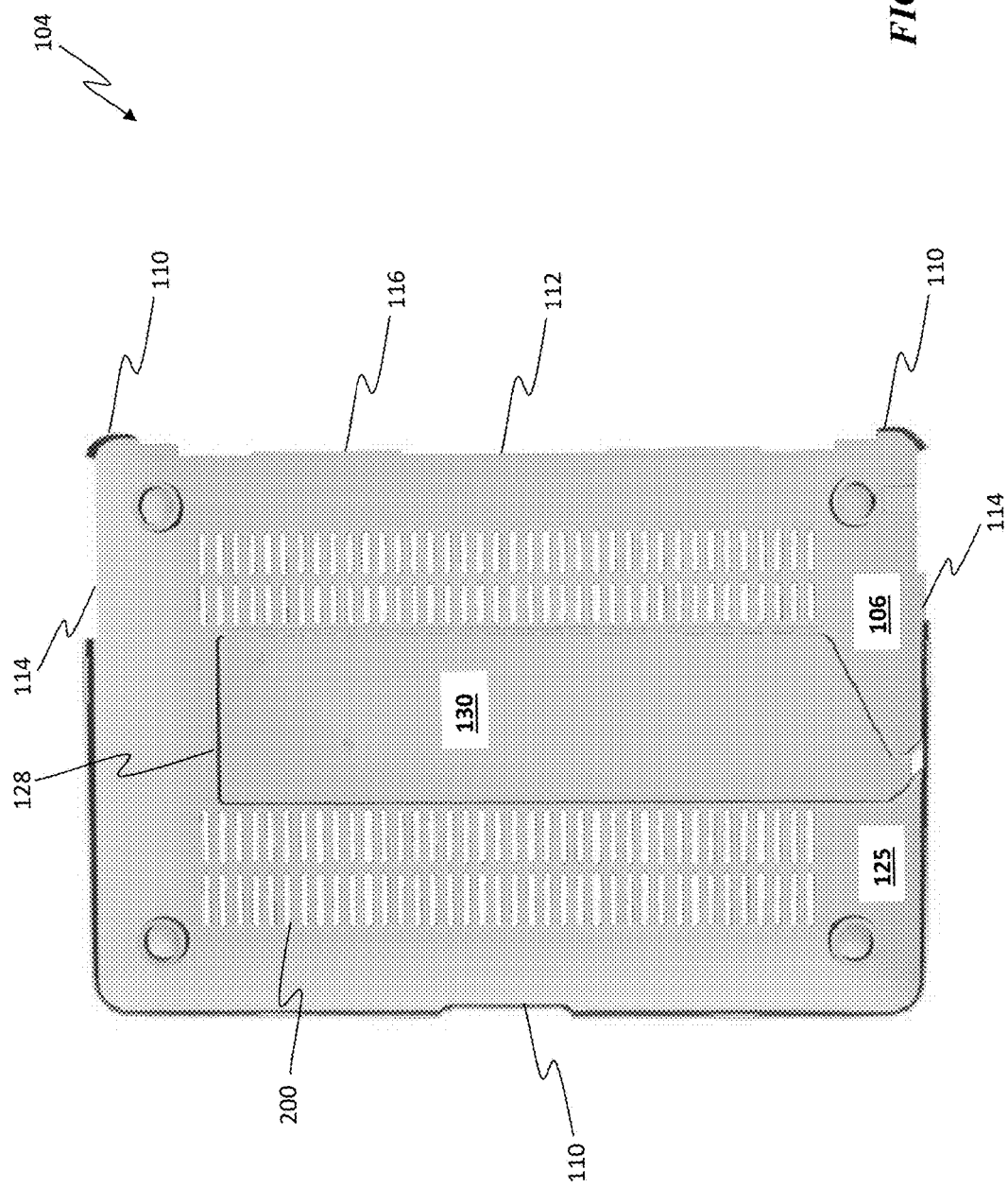
FIG. 3 is a top down view of the structure base of FIG. 2, without the base cover.
Figure 4:
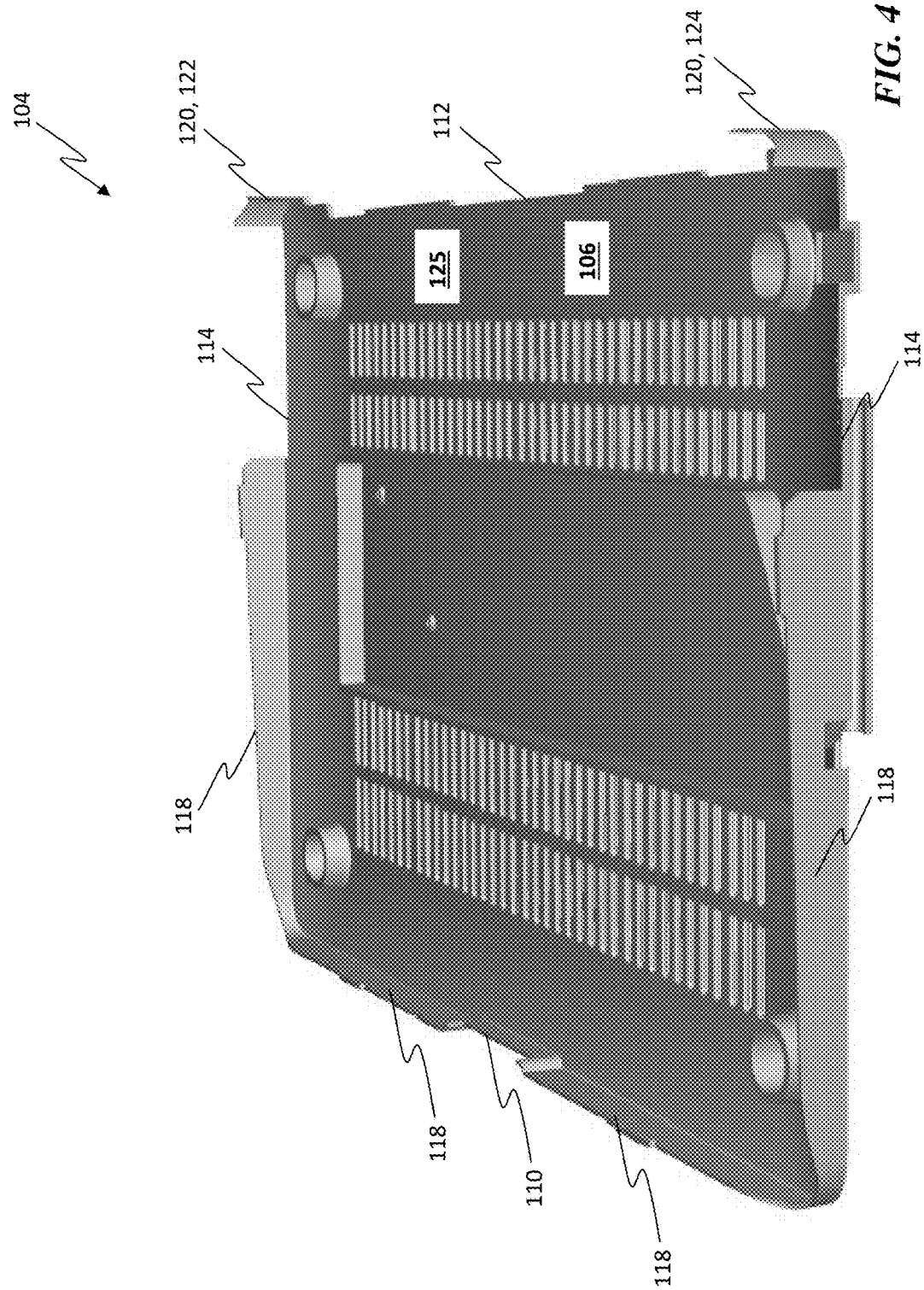
FIG. 4 is side, top down isometric view of the structure base of FIG. 2, without the base cover.
Figure 5:
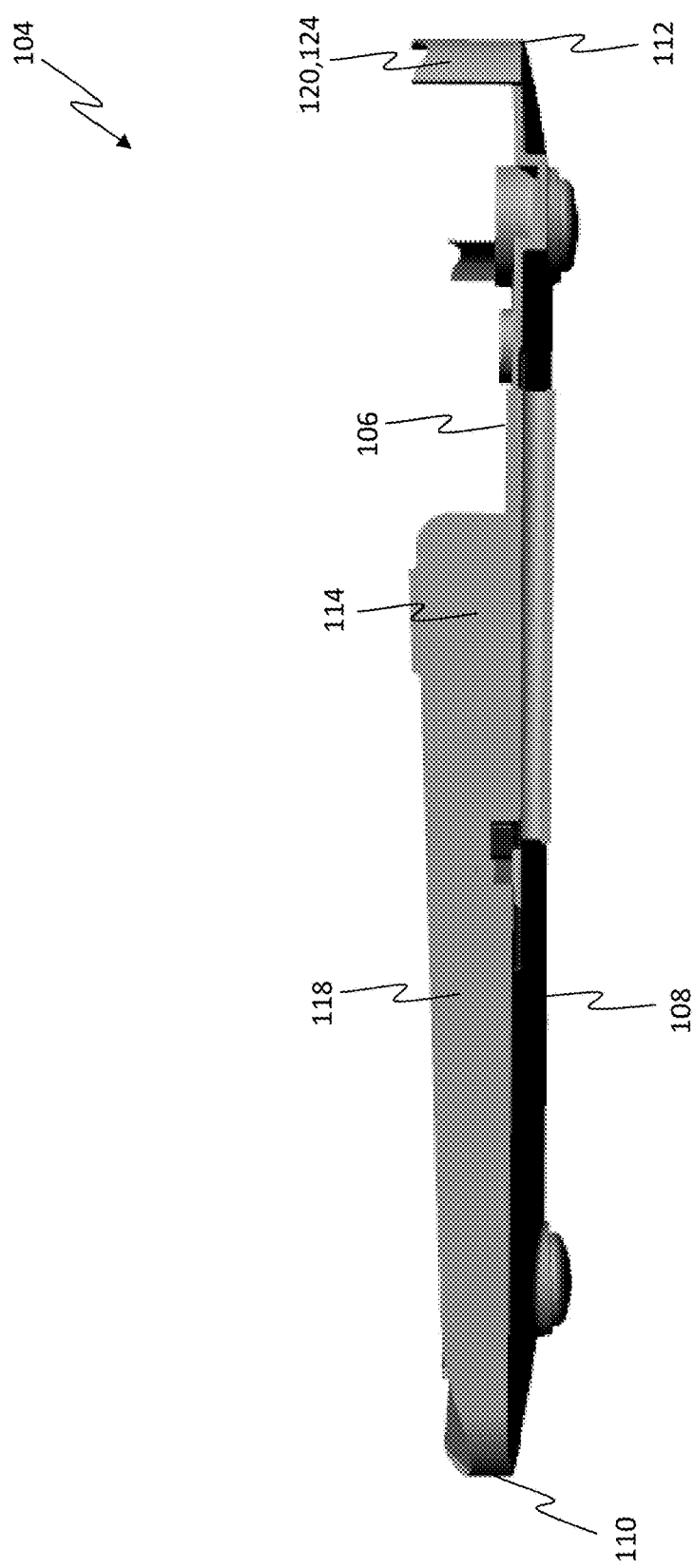
FIG. 5 is a side view of the structure base of FIG. 2.
Figure 6:
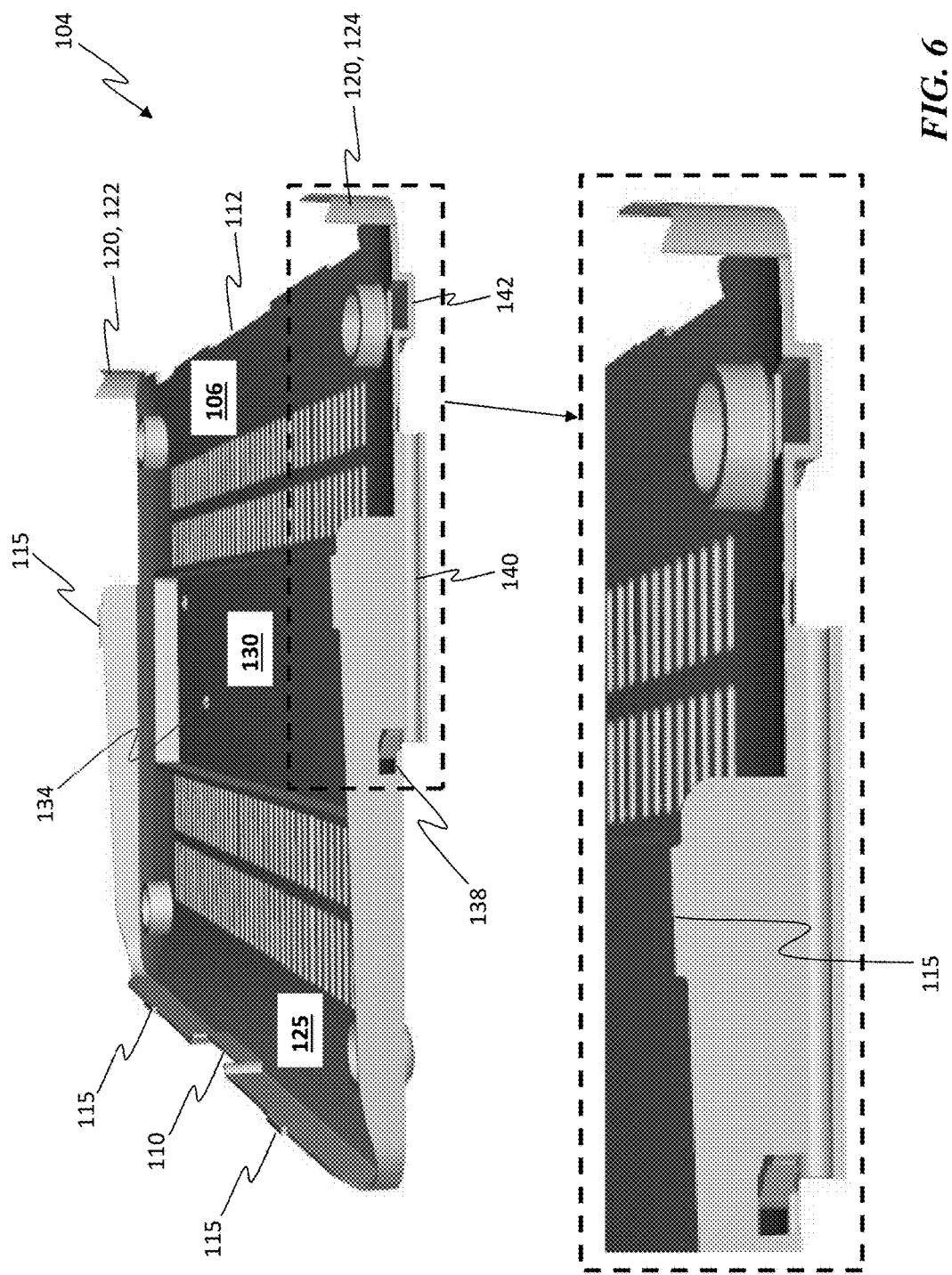
FIG. 6 is a top down side isometric view of the structure base of FIG. 2, showing an exploded view of the right rear corner.

Referring to FIG. 1, an auxiliary hard drive mounting article 100 is shown in accordance with one embodiment of the present invention, wherein the auxiliary hard drive mounting article 100 includes an article structure 102 having a structure base 104 and a structure top cover 105. It should be appreciated that the auxiliary hard drive mounting article 100 is configured to be low profile such that when the auxiliary hard drive mounting article 100 is associated with a laptop, the profile of the auxiliary hard drive mounting article 100 is minimized. Referring to FIGS. 2-6, the structure base 104 includes a base top 106, a base bottom 108, a base front 110, a base rear 112, base sides 114 and a base edge 116 wherein the base edge 116 extends along the peripheral of the structure base 104. The structure base 104 includes at least one front base wall 118 located proximate the base edge 116, wherein the base wall 118 extends upward from the base top 106 and extends at least partially along a portion of the base edge 116 on the base front 110 and/or the base sides 114. Additionally, the structure base 104 may further include at least one rear base wall 120. For example, in this embodiment, the structure base 104 includes a first rear base wall 122 and a second rear base wall 124, wherein the first rear base wall 122 extends upward from the base top 106 and extends at least partially along a portion of one corner of the base edge 116 on the base rear 112 and/or the base sides 114 and the second rear base wall 124 extends upward from the base top 106 and extends at least partially along a portion of the other corner of the base edge 116 on the base rear 112 and/or the base sides 114. It should be appreciated that the base top 106, the at least one front base wall 118 and the at least one rear base wall 120 define a structure base cavity 125 which is configured to contain a laptop (or tablet) computing device 126.

Figure 10:
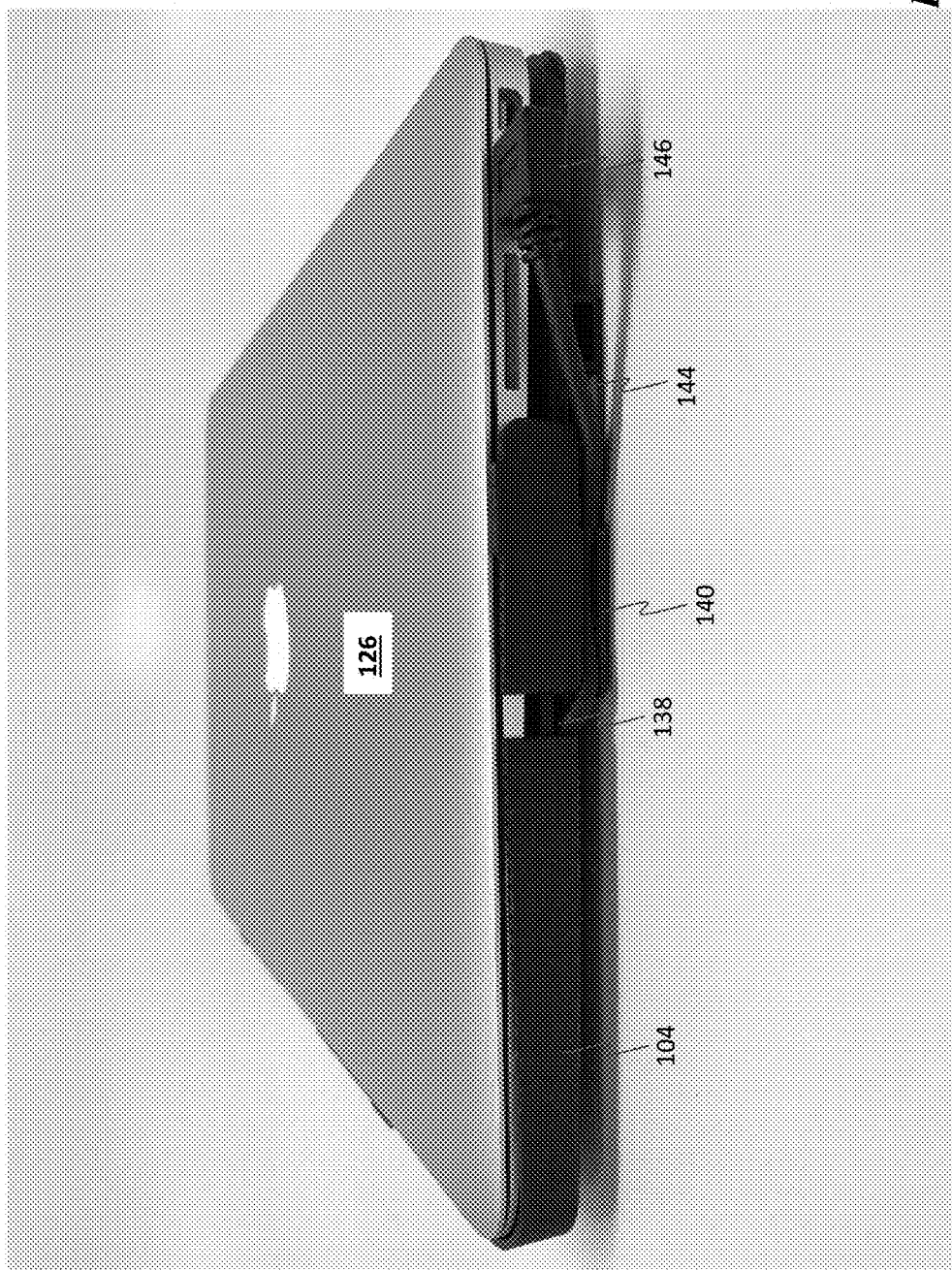
FIG. 10 is a side view of a laptop computing device associated with the structure base of FIG. 2, with the laptop computing device in an opened configuration.

Moreover, the front base wall 118 includes one or more wall protrusions 115 that are located proximate the top of the front base wall 118 and that extend outwardly from the front base wall 118 in a direction that is substantially perpendicular to the surface of the front base wall 118 and that is toward the structure base cavity 125. It should be appreciated that when the laptop computing device 126 is associated with the structure base 104, the one or more wall protrusions 115 interact with the body of the laptop computing device 126 to secure the laptop computing device 126 within the structure base cavity 125. Referring to FIG. 10, it should be further appreciated that the structure base cavity 125 may be sized such that when a computing device (i.e. a laptop, tablet, etc. . . . ) 126 is located within the structure base cavity 125, the enclosure of the computing device 126 fits snugly and frictionally interacts with the at least one front base wall 118, first rear base wall 122 and second rear base wall 124 to be securely and removably associated with the structure base 104. Additionally, it is contemplated that in other embodiments the computing device (i.e. a laptop, tablet, etc. . . . ) 126 may be securely contained within the structure base cavity 125 via any device and/or method suitable to the desired end purpose, such as friction fit, clips, snaps, screws, Velcro® and/or adhesive.

Figure 7:
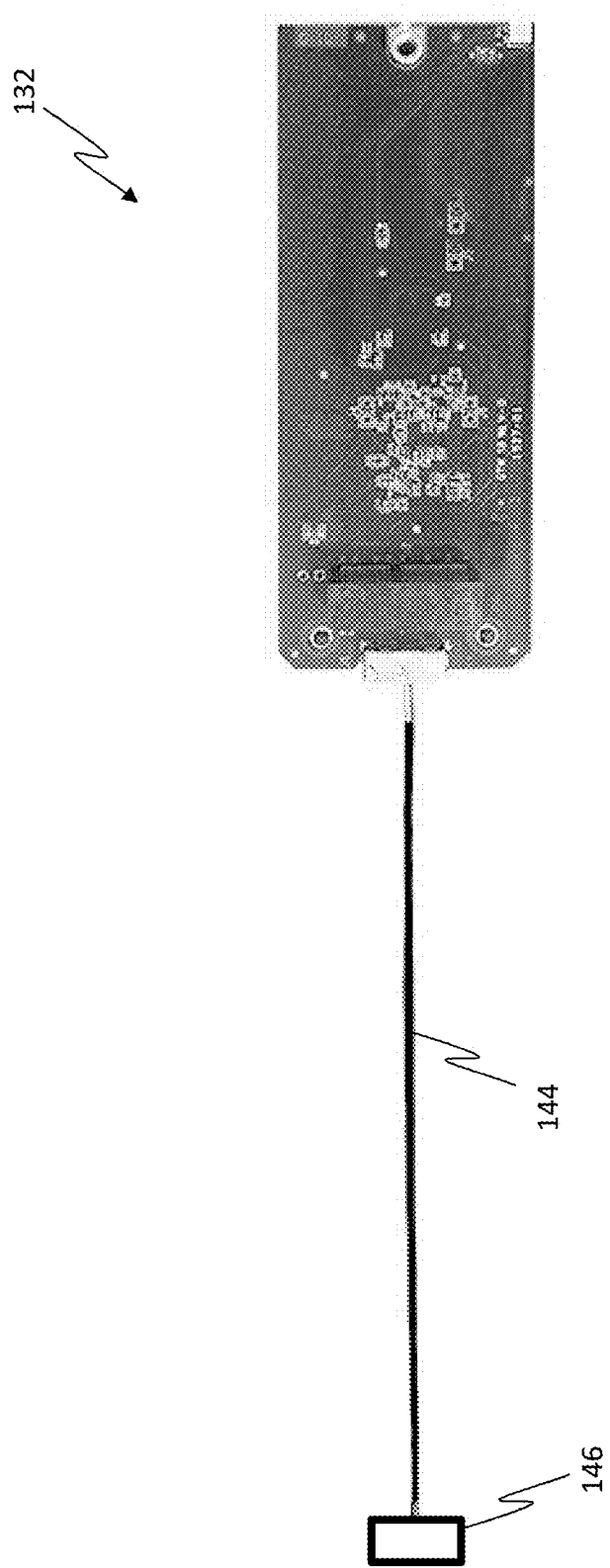
FIG. 7 is a top down view of an auxiliary hard drive for use with the structure base of FIG. 2, in accordance with one embodiment of the present invention.
Figure 8:
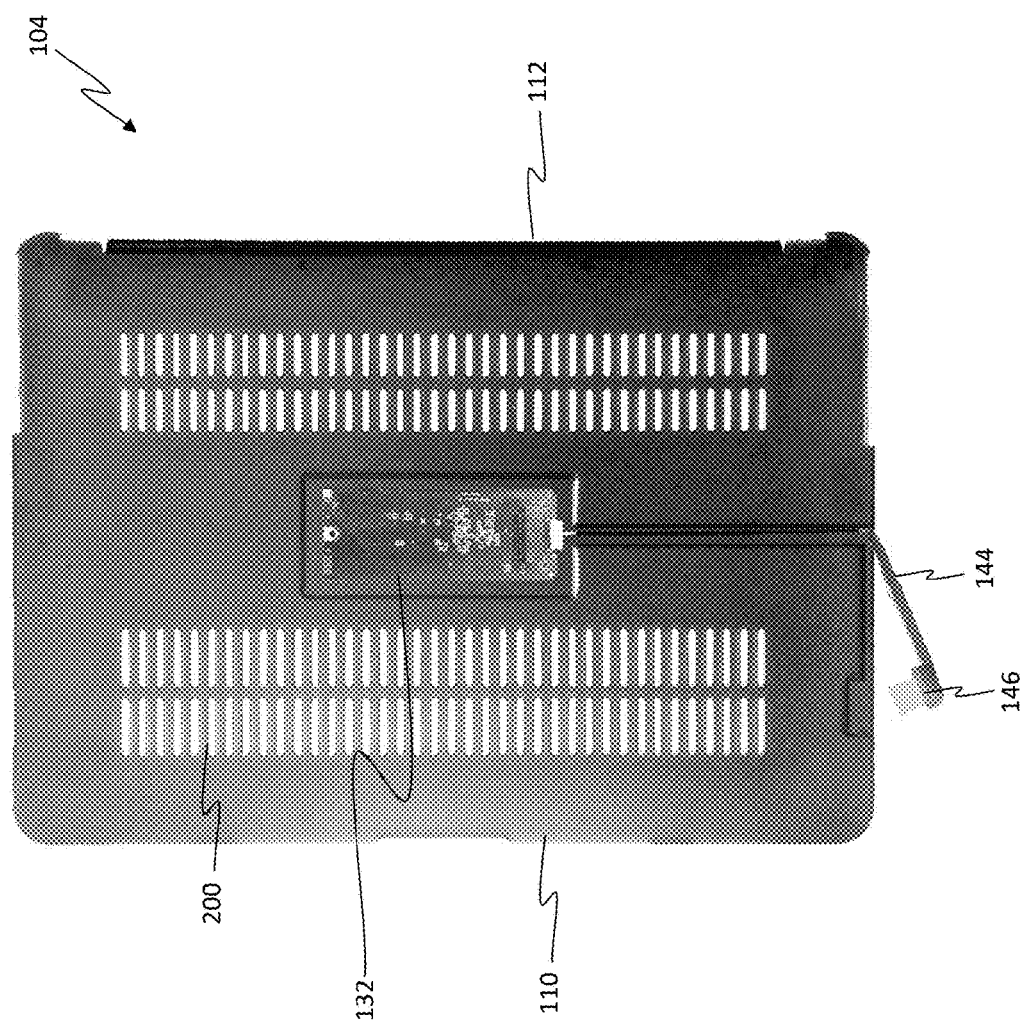
FIG. 8 is a top down view of the auxiliary hard drive of FIG. 7 associated with the structure base of FIG. 2, in accordance with one embodiment of the present invention.
Figure 9:
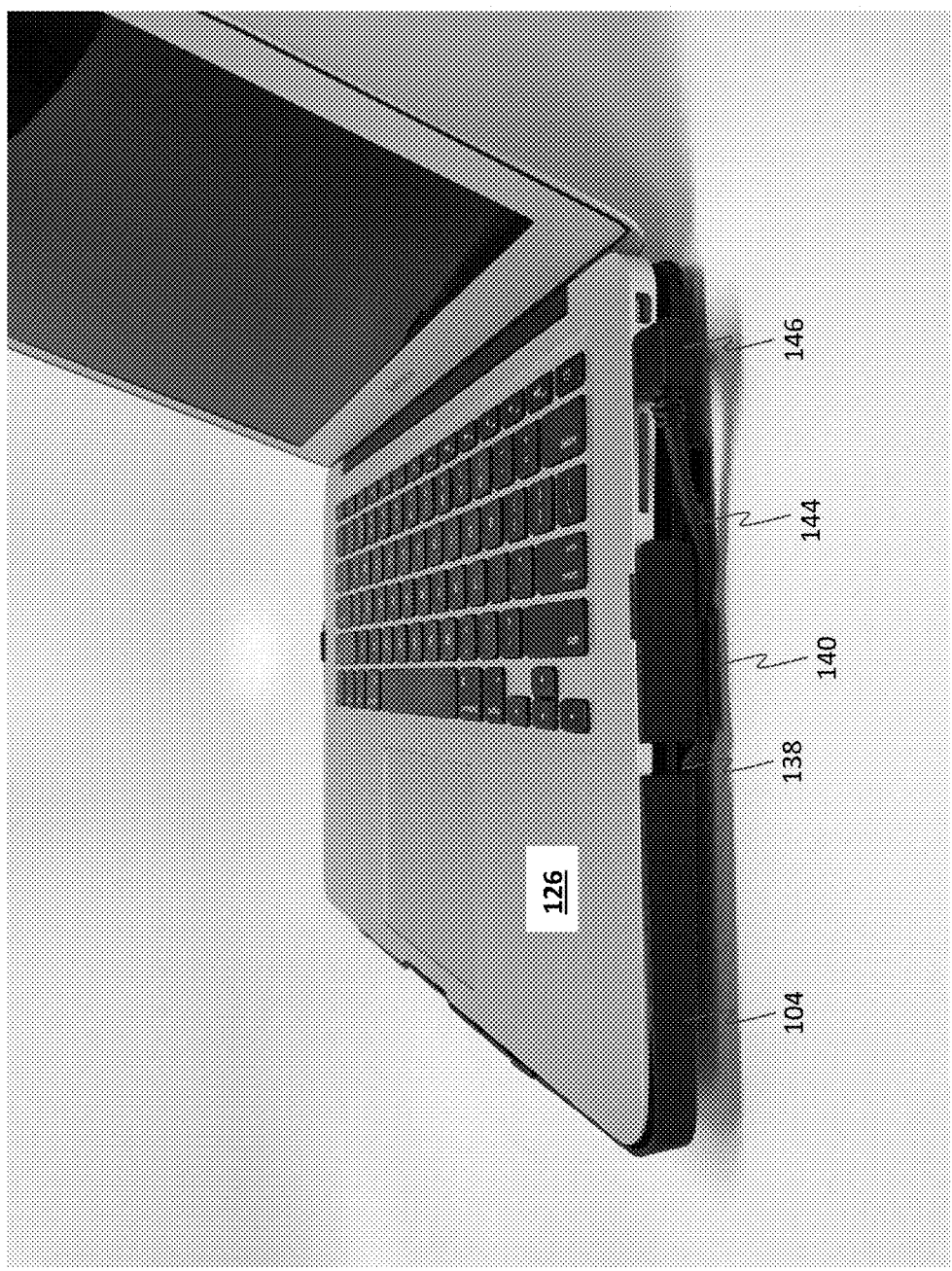
FIG. 9 is a side view of a base cover being associated with the structure base of FIG. 2 to cover the structure base cavity, in accordance with one embodiment of the present invention.

The structure base 104 also includes a component cavity wall 128 which extends upward from the base top 106, wherein the component cavity wall 128 defines a component cavity 130 for containing a component, such as an auxiliary hard drive 132 (See FIG. 7). It should be appreciated that the structure base 104 may include one or more drive mounting openings 134 located within the component cavity 130 which communicate the base bottom 108 with the base top 106. These drive mounting openings 134 allow the auxiliary hard drive 132 to be securely mounted to the structure base 104 via one or more mounting screws. It should be further appreciated that the structure base 104 includes a cable opening 138 which is communicated with the component cavity 130. Additionally, the structure base 104 further includes a cable storage mount 140 and a cable connector mount 142, wherein the cable storage mount 140 and/or cable connector mount 142 are located proximate the cable opening 138.

Referring to FIG. 7, FIG. 8, FIG. 9 and FIG. 10, it is contemplated that the auxiliary hard drive 132 includes a connector cable 144 having a cable connector 146 and when the auxiliary hard drive 132 is securely located within the component cavity 130, the connector cable 144 protrudes out of the cable opening 138 to allow the cable connector 146 to connect to the laptop computing device (i.e. a laptop, tablet, etc. . . . ) 126 which is associated with the structure base 104. When the laptop computing device 126 is not in use, the connector cable 144 may be associated with the cable storage mount 140 and the cable connector 146 may be associated with the cable connector mount 142. This advantageously allows the connector cable 144 to be securely stored away to prevent the connector cable 144 and/or cable connector 146 from being damaged. It should be appreciated that in one embodiment, the cable storage mount 140 and/or the cable connector mount 142 may be sized to frictionally and securely contain the connector cable 144 and/or cable connector 146, respectively. It is contemplated that in other embodiments, the connector cable 144 and/or cable connector 146 may be securely contained within the cable storage mount 140 and/or the cable connector mount 142, respectively, via any method and/or device suitable to the desired end purpose, such as friction fit, clips, snaps, screws, Velcro®, adhesive and/or one or more protrusions which frictionally interact with the connector cable 144 and/or the cable connector 146.

Figure 11:
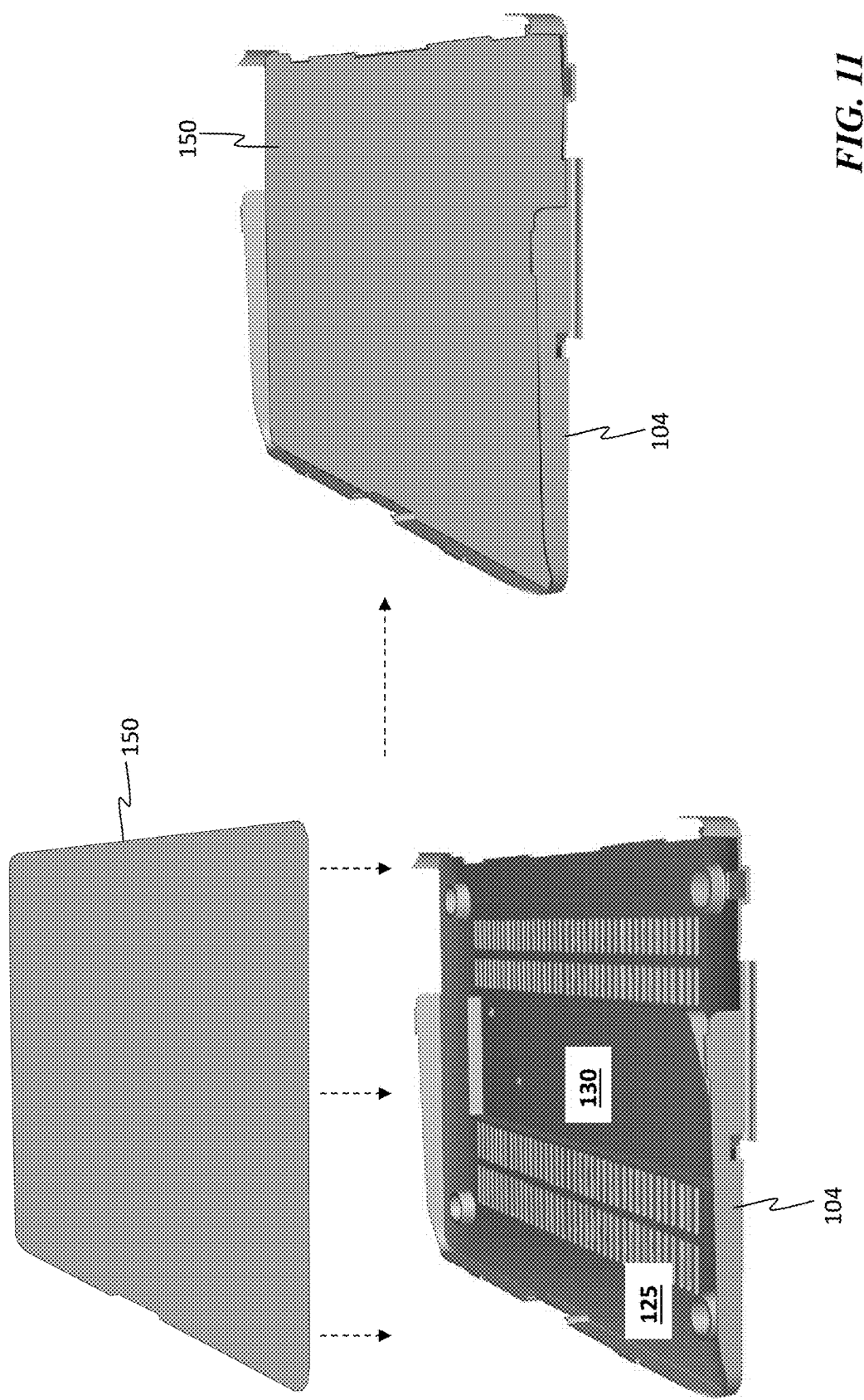
FIG. 11 is a side view of a laptop computing device associated with the structure base of FIG. 2, with the laptop computing device in a closed configuration.

Referring to FIG. 11, the hard drive mounting system 100 further includes a base cover 150, wherein the base cover 150 is configured to cover and at least partially enclose the structure base cavity 125. The base cover 150 is sized and shaped to frictionally interact with the front base wall 118, the first rear base wall 122 and the second rear base wall 124 to be securely contained within the structure base cavity 125 when the base cover 150 is associated with the structure base 104. It should be appreciated that in other embodiments the base cover 150 may be securely associated with the structure base 104 via any method and/or device suitable to the desired end purpose, such as screws, snaps, clips, adhesive and/or Velcro®. For example, in one embodiment, the structure base 104 may include one or more base mount openings and the base cover 150 may include one or more cover mount structures, wherein the cover mount structures may define a threaded cavity for receiving and containing a mounting screw 136. It should be appreciated that the base mount openings and the cover mount structures may be located relative to each other such that when the base cover 150 is associated with the structure base 104, the base mount openings and the cover mount structures are aligned, thereby allowing a mounting screw to be inserted through the base mount openings and into the threaded cavity of the cover mount structures such that the mounting screw 136 may threadingly interact with the threaded cavity of the cover mount structures.

Moreover, it should also be appreciated that in other embodiments, any device and/or method may be used to securely associate the auxiliary hard drive 132 and/or connector cable 144 with the structure base 104 suitable to the desired end purpose, such as a friction fit, clips, snaps, screws, Velcro® and/or adhesive. For example, in one embodiment it is contemplated that the auxiliary hard drive 132 may be frictionally and/or compressingly contained with the component cavity 130. In this embodiment, the component cavity 130 may be sized such that when the auxiliary hard drive 132 is located therein, the sides of the auxiliary hard drive 132 may be in contact with the component cavity wall 128 such that the auxiliary hard drive 132 is snugly and frictionally contained therein. In yet another embodiment, when the base cover 150 is securely associated with the structure base 104, the base cover 150 may be compressed onto the top of the auxiliary hard drive 132 thereby securing the auxiliary hard drive 132 within the component cavity 130.

Additionally, in still yet another embodiment, the auxiliary hard drive 132 may be mounted within the component cavity 130 in a molded mount designed specifically for the type of auxiliary hard drive 132 that is being used. As such, the auxiliary hard drive 132 may be seated within the mold where it attaches to the connector cable 144. Moreover, it should be appreciated that the cable connector 146 may be any type of cable connector 146 desired suitable to the desired end purpose, such as USB, Thunderbolt, etc. Additionally, in some embodiments, a cellular hotspot implant may be provided which would allow access to an internet connection. This would serve two purposes for the product: 1) Functionality of also being able to offer an internet connection though cellular data and 2) Offering a cloud based backup service for the internal and/or auxiliary hard drive 132.

In accordance with the invention, the structure base 104 may include a plurality of ventilation slots 200 to aid in cooling of the processing device (i.e. a laptop, tablet, etc. . . . ). Additionally, in other embodiments the structure base 104 may include ventilation slots within the component cavity 130 to help prevent the auxiliary hard drive 132 from getting over heated. In still yet other embodiments, a fan, other cooling apparatus and/or other method (such as an insulative covering) may be used to insulate or isolate the auxiliary hard drive 132 from the processing device (i.e. laptop, tablet, etc . . . ) to keep the auxiliary hard drive 132 from becoming heated. Also, the present invention may be used for other type of devices (other than auxiliary hard drive 132) as desired and suitable to the desired end result.

Figure 12:
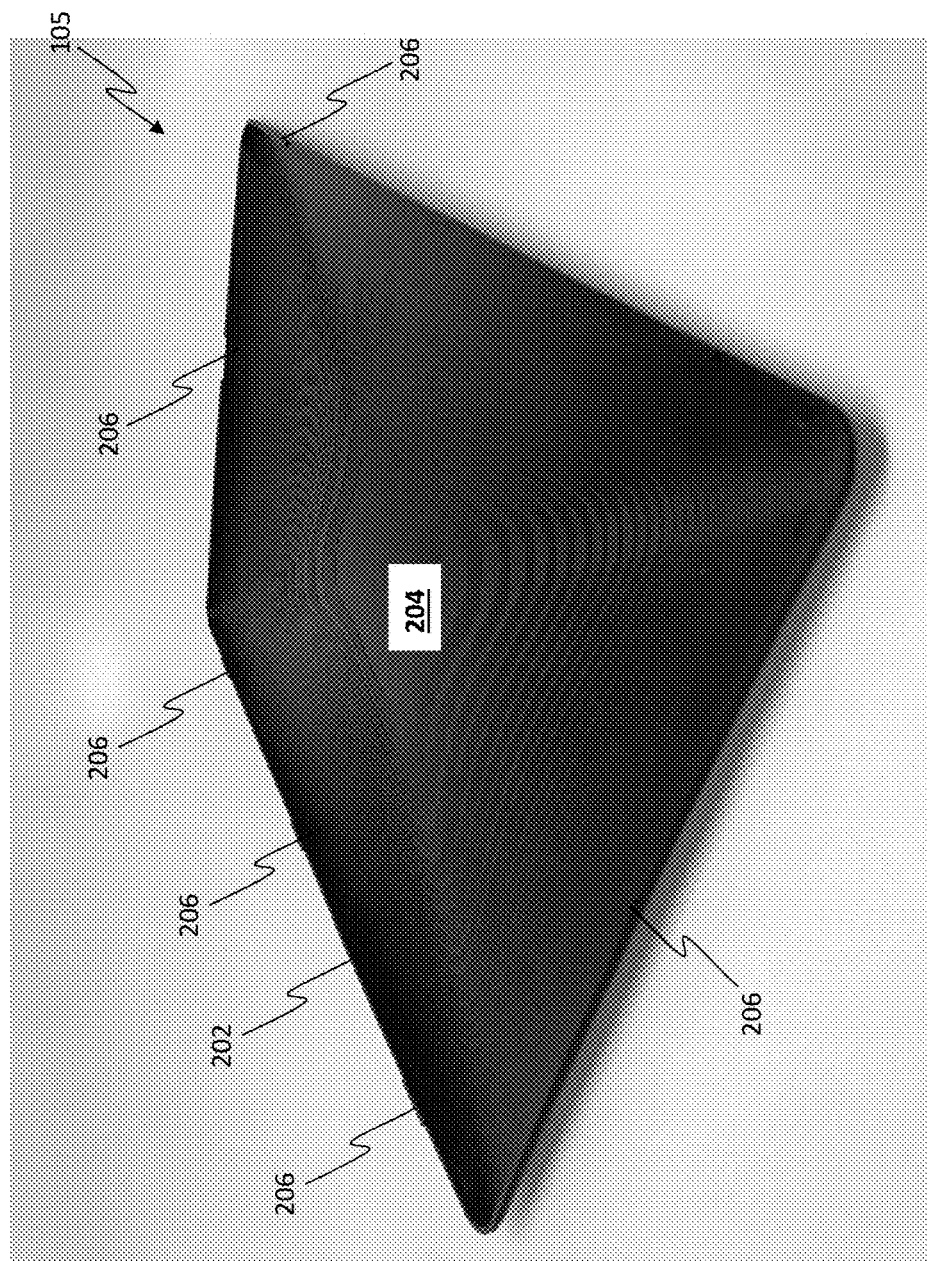
FIG. 12 is a bottom up side isometric view of the laptop cover, of the auxiliary hard drive mounting article of FIG. 1, in accordance with one embodiment of the invention.
Figure 13:
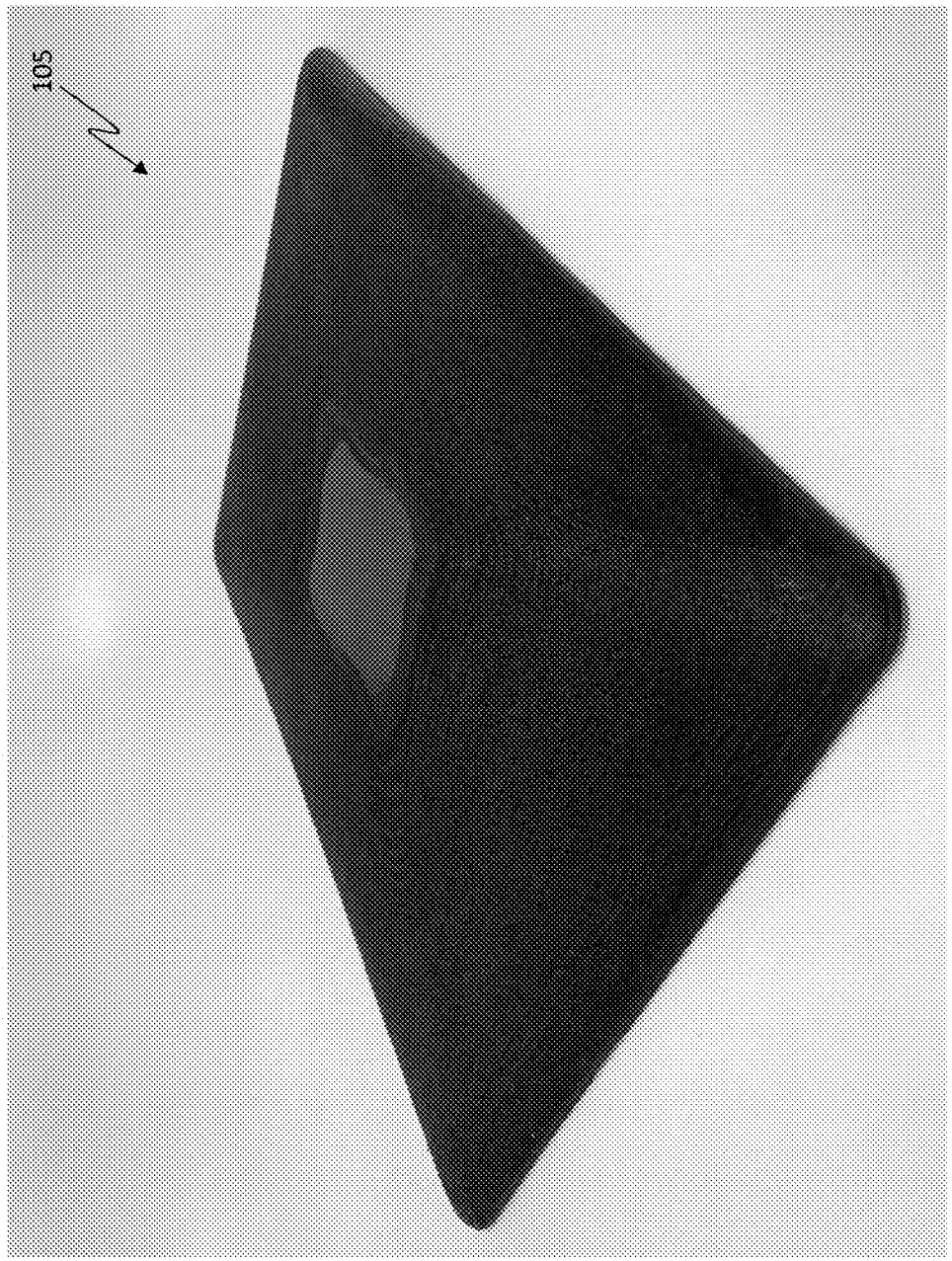
FIG. 13 is a top down side isometric view of the laptop cover of FIG. 12.
Figure 14:
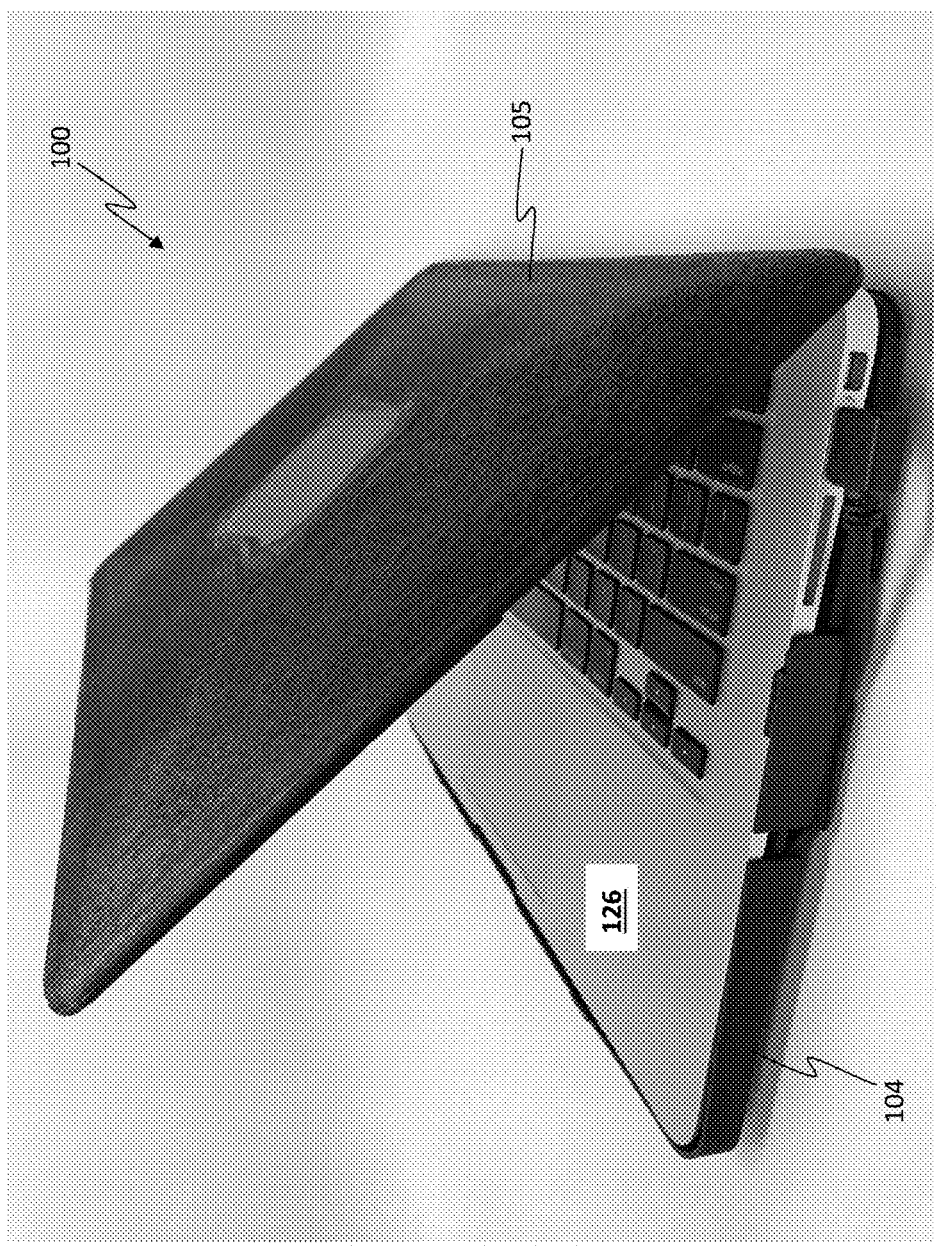
FIG. 14 is a rear side view of a laptop computing device associated with the auxiliary hard drive mounting article of FIG. 1, with the laptop computing device in an opened configuration.
Figure 15:
FIG. 15 is a top down view of a structure base of an auxiliary hard drive mounting article device, in accordance with still yet another embodiment of the invention.
Figure 16:
FIG. 16 is a bottom up down view of the structure base of FIG. 15.
Figure 17:
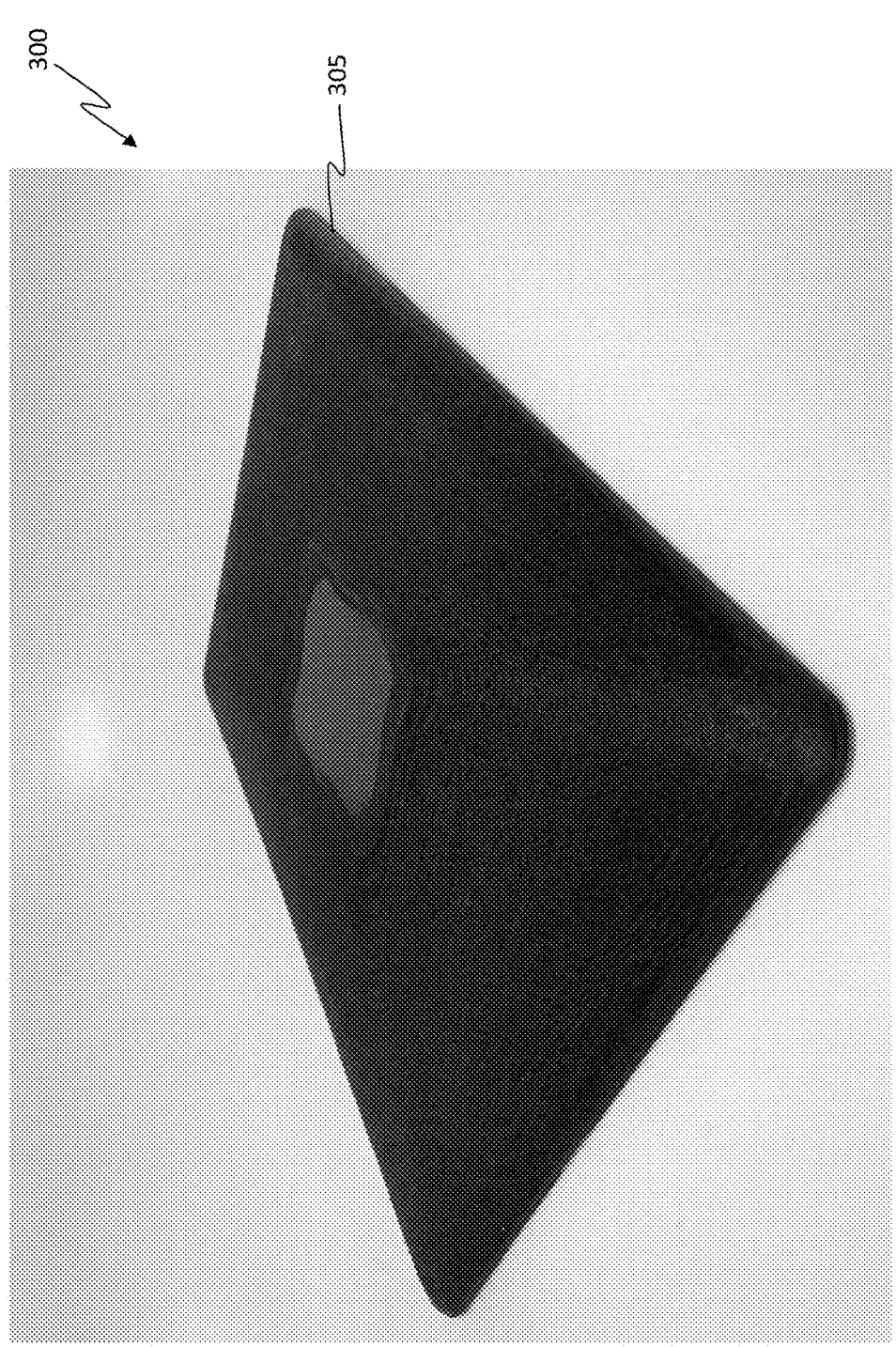
FIG. 17 is a top down side perspective view of a structure top cover of the auxiliary hard drive mounting article device of FIG. 15.
Figure 18:
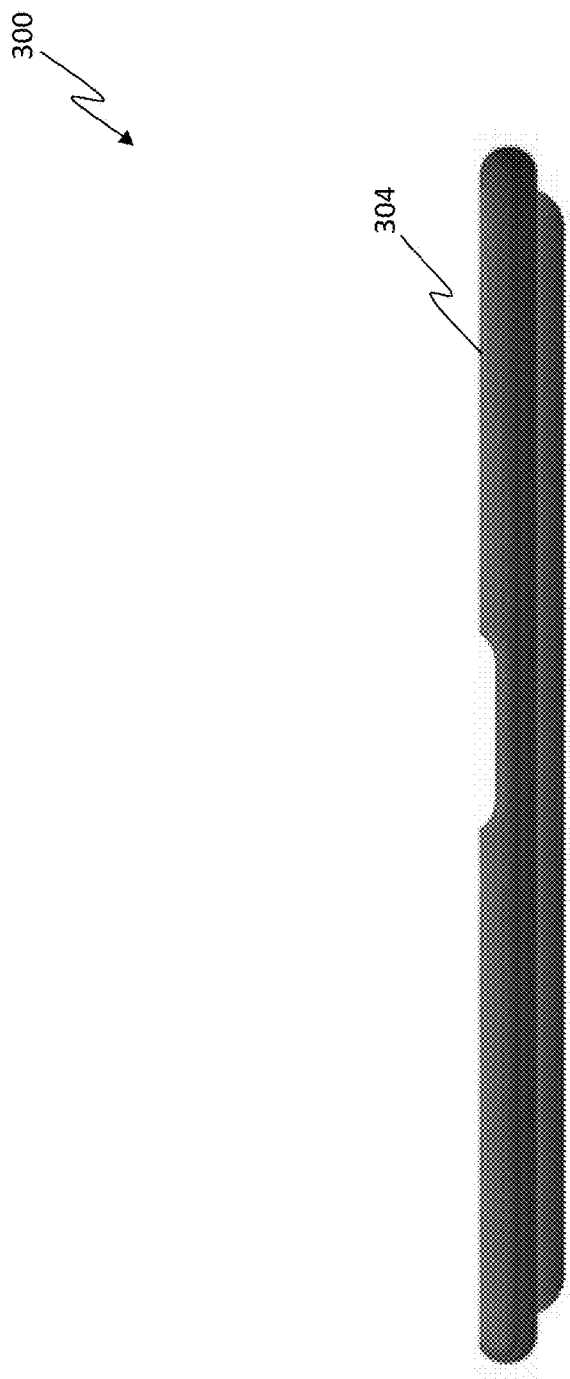
FIG. 18 is a front view of the structure base of FIG. 15.
Figure 19:
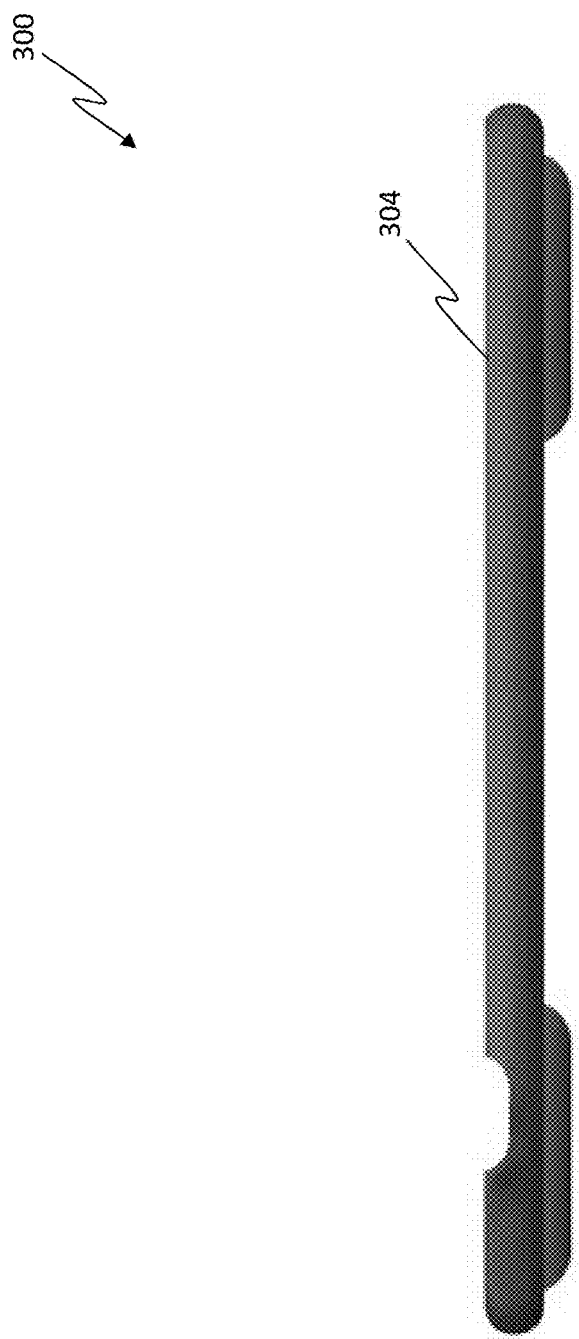
FIG. 19 is a left side view of the structure base of FIG. 15.
Figure 20:
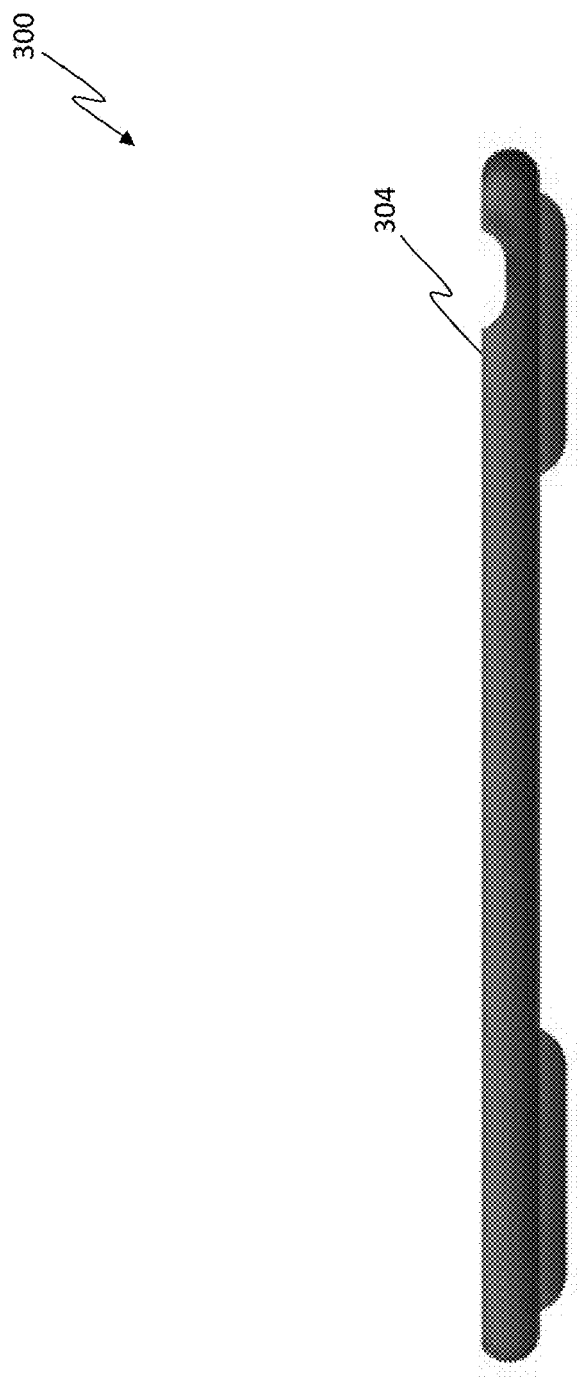
FIG. 20 is a right side view of the structure base of FIG. 15.

Referring to FIG. 12, FIG. 13 and FIG. 14, the structure top cover 105 is shown, wherein the structure top cover 105 includes a top cover wall 202 which extends at least partially along the perimeter of the structure top cover 105 to define a top cover cavity 204 which is sized and shaped to contain the top (i.e. the back of the screen portion) of the laptop (or tablet) computing device 126. The top cover wall 202 includes a plurality of clips or protrusions 206 that are located along the top cover wall 202 that are configured to securingly interact with the top (i.e. the back of the screen portion) of the laptop (or tablet) computing device 126 to securely retain the top (i.e. the back of the screen portion) of the laptop (or tablet) computing device 126 therein. It should be appreciated that in at least one other embodiment, the top cover 105 may not include a top cover wall 202. For example, the structure top cover 105 may be "bowl" shaped such that the top cover cavity 204 is shallow enough to securely contain the top (i.e. the back of the screen portion) of the laptop (or tablet) computing device 126 as described hereinabove.

Referring to FIGS. 15-20, an auxiliary hard drive mounting article 300, in accordance with still yet another embodiment of the invention is provided and includes a structure base 304 and/or a structure top cover 305. The structure base 304 and/or structure top 305, may be completely constructed of a flexible and/or resilient material (such as rubber, polyethylene, etc . . . ) or the structure base 304 and/or structure top may be partially constructed of a flexible and/or resilient material (such as rubber, polyethylene, etc . . . ). For example, in one embodiment the corner portions of the structure base 304 and/or the structure top cover 305 may be constructed from a flexible and/or resilient material while the middle portion of the structure base 304 and/or the structure top cover 305 may be constructed from a rigid material. The structure base 304 is configured to associate with the base of the computing device 126, wherein the flexible and resilient structure base 304 may fit snugly (like a glove or sock, for example) over the base of the computing device 126. Moreover, the structure base 304 may include additional padding material located at key locations to provide impact protection for the computing device 126. For example, the flexible and resilient structure base 304 may include thicker material and/or padding along the edges and/or the corners of the structure base 304 to protect the computing device 126. The flexible and/or resilient structure base 304 may be stretched to fit over the base of the computing device 126 and elastically interact with the base of the computing device 126.

Figure 21:
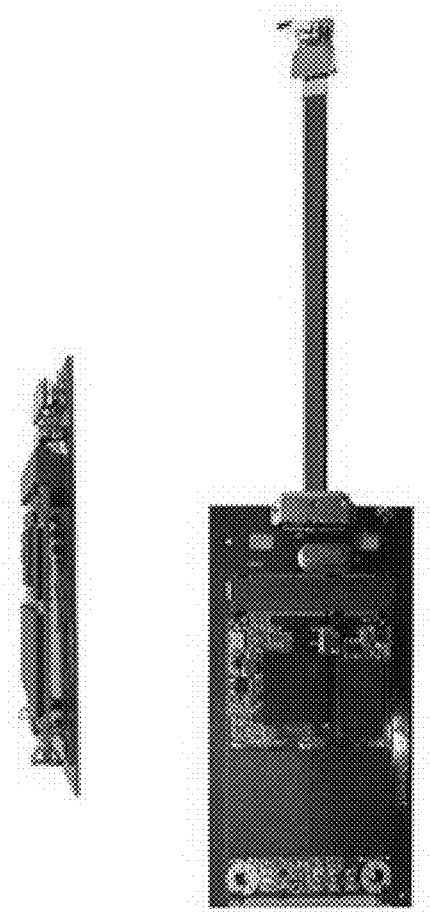
FIG. 21 is a top down view and an end view of a component for use with the structure base of FIG. 15, in accordance with another embodiment of the present invention.
Figure 22:
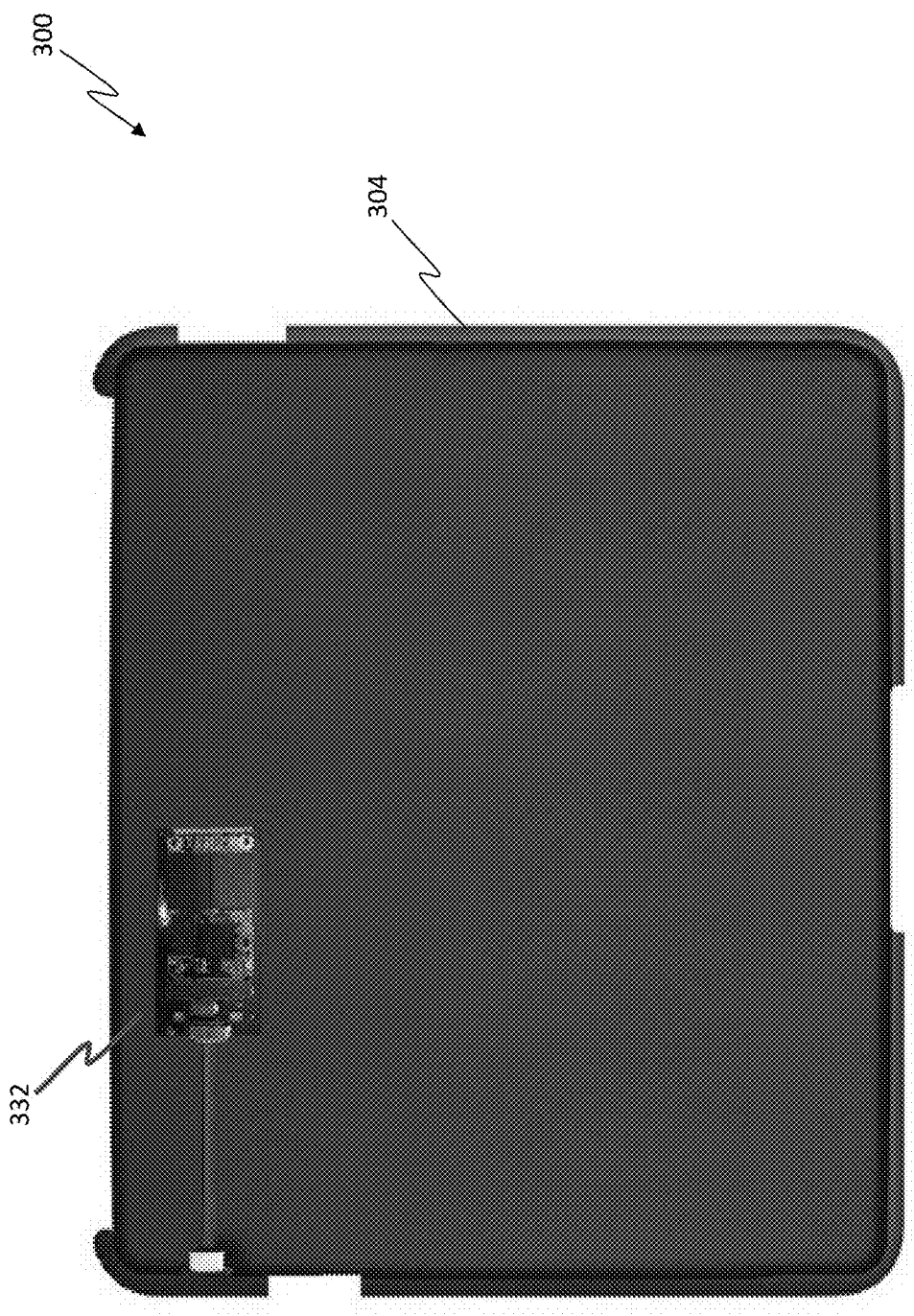
FIG. 22 is a top down view of the component of FIG. 20 associated with the structure base of FIG. 15.

Additionally, because not all computing devices 126 are configured alike, it is contemplated that the flexible and/or resilient structure base 304 may be specially designed to fit a specific brand and/or model of computing device 126. Furthermore, it is contemplated that the structure top cover 305 may also be configured as a resilient and/or flexible top cover 105 and designed to snugly and frictionally associate with the top (i.e. the back of the screen portion) of the computing device 126. Moreover, as with the other embodiment, the structure base 304 may be configured to securely associate with a component 332, wherein the structure base 304 may include a component cavity 130 for containing the component 332, such as an auxiliary hard drive. In another embodiment, the structure base 304 may not specifically include the component cavity 130, but rather may simply have a mounting clip (or other mounting device) for securing the component 332 within the structure base 304. Referring to FIG. 21 and FIG. 22, another embodiment of the component 332 is shown, wherein the component 332 is securely associated with the structure base 304. It should be appreciated that the invention is not limited to an external hard drive, but rather may be used to associate any component with a device suitable to the desired end purpose.

It should be appreciated that while the invention has been described with reference to an exemplary embodiment, it will be understood by those skilled in the art that various changes, omissions and/or additions may be made and equivalents may be substituted for elements thereof without departing from the spirit and scope of the invention. Moreover, embodiments and/or parts/elements of embodiments disclosed herein may be combined as desired. In addition, many modifications may be made to adapt a particular situation or material to the teachings of the invention without departing from the scope thereof. Therefore, it is intended that the invention not be limited to the particular embodiment disclosed as the best mode contemplated for carrying out this invention, but that the invention will include all embodiments falling within the scope of the appended claims. Moreover, unless specifically stated any use of the terms first, second, etc. do not denote any order or importance, but rather the terms first, second, etc. are used to distinguish one element from another.

I claim:

1. A low profile auxiliary hard drive mounting article, comprising:
 a structure top cover; and
 a structure base, wherein the structure base includes a base top, a base bottom, a base front, a base rear and base sides which define a base cavity, wherein the structure top cover is configured to at least partially enclose the base cavity, and
  wherein the structure base further includes a cable opening and a component cavity wall that defines a component cavity, wherein the cable opening is communicated with the component cavity, and
  wherein the component cavity is configured to contain an auxiliary hard drive and at least a portion of a connector cable having a cable connector, wherein the cable opening is configured to allow at least a portion of the connector cable and the cable connector to extend therefrom, and
  wherein the structure base further includes a cable storage mount and a cable connector mount, wherein the cable storage mount is located proximate the cable opening and wherein the cable storage mount is configured to securingly contain the connector cable and the cable connector mount is configured to securingly contain the cable connector.

2. The low profile auxiliary hard drive mounting article of claim 1, wherein the cable storage mount is located on at least one of the base sides and is configured to securingly contain the connector cable via a friction fit.

3. The low profile auxiliary hard drive mounting article of claim 1, wherein the cable connector mount is located proximate the connector cable mount and is configured to securingly contain the cable connector cable via a friction fit.

4. The low profile auxiliary hard drive mounting article of claim 1, wherein the cable connector is a USB connector.

5. The low profile auxiliary hard drive mounting article of claim 1, wherein the structure top is configured to associate with a screen portion of a laptop computing device.

6. The low profile auxiliary hard drive mounting article of claim 1, wherein the component cavity wall is located within the base cavity and extends upward from the base top.

7. The low profile auxiliary hard drive mounting article of claim 1, further including a base cover, wherein the base cover is configured to securely engage with the structure base to at least partially cover the base cavity.

8. The low profile auxiliary hard drive mounting article of claim 1, wherein the structure base further includes at least one front base wall and at least one rear base wall, wherein the at least one front base wall and at least one rear base wall are located to at least partially surround the base cavity.

9. The low profile auxiliary hard drive mounting article of claim 1, wherein the structure base further includes at least one front base wall which includes a plurality of protrusions, wherein the plurality of protrusions are located proximate the base cavity and are configured to interact with a laptop computing device when the laptop computing device is located within the base cavity.

10. A low profile component mounting article, comprising:
 a structure base, wherein the structure base includes a base top, a base bottom, a base front, a base rear and base sides which define a base cavity, and
  wherein the structure base further defines a component cavity and a cable opening, wherein the cable opening is communicated with the component cavity, and
  wherein the component cavity is configured to contain an auxiliary component and at least a portion of a connector cable having a cable connector, wherein the cable opening is configured to allow at least a portion of the connector cable and the cable connector to extend therefrom, and
 wherein the structure base further includes a cable storage mount and a cable connector mount, wherein the cable storage mount is located proximate the cable opening.

11. The low profile component mounting article of claim 10, wherein the auxiliary component is an auxiliary hard drive.

12. The low profile component mounting article of claim 10, further including a base cover, wherein the base cover is configured to securely engage with the structure base to at least partially cover the base cavity.

13. The low profile component mounting article of claim 10, wherein the cable storage mount is located on at least one of the base sides and is configured to securingly contain the connector cable via a friction fit.

14. The low profile component mounting article of claim 10, wherein the cable connector mount is located proximate the connector cable mount and is configured to securingly contain the cable connector cable via a friction fit.

15. A low profile component mounting article, comprising:
 a structure base, wherein the structure base defines a base cavity for containing a laptop computing device,
  wherein the structure base further defines a cable opening and is configured to contain an auxiliary component having a connector cable, wherein the cable opening is communicated with the base cavity, and
  wherein when the auxiliary component is located within the base cavity, at least a portion of the extends out of the cable opening, and
  wherein the structure base further includes a cable storage mount located proximate the cable opening and configured to removably contain the connector cable and a cable connector mount located proximate the cable storage mount and configured to removably contain the cable connector.

16. The low profile component mounting article of claim 15, wherein the auxiliary component is an auxiliary hard drive.

17. The low profile component mounting article of claim 15, further including a base cover, wherein the base cover is configured to securely engage with the structure base to at least partially cover the base cavity.

18. The low profile component mounting article of claim 15, wherein the cable storage mount is located on at least one of the base sides and is configured to securingly contain the connector cable via a friction fit.

19. The low profile component mounting article of claim 15, wherein the cable connector mount is located proximate the connector cable mount and is configured to securingly contain the cable connector cable via a friction fit.

20. The low profile hard drive mounting article of claim 15, wherein the structure base further includes at least one front base wall which includes a plurality of protrusions, wherein the plurality of protrusions are located proximate the base cavity and are configured to interact with a laptop computing device when the laptop computing device is located within the base cavity.

* * * * *